United States Patent
Lee et al.

(10) Patent No.: US 8,891,682 B2
(45) Date of Patent: Nov. 18, 2014

(54) HARMONIC ELIMINATION MIXER

(75) Inventors: Chao-Cheng Lee, Hsin-Chu (TW); Ying-Yao Lin, Hsin-Chu Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 1080 days.

(21) Appl. No.: 11/559,396

(22) Filed: Nov. 13, 2006

(65) Prior Publication Data
US 2007/0111696 A1    May 17, 2007

(30) Foreign Application Priority Data
Nov. 15, 2005 (TW) ................................ 94140094 A (51) Int. Cl.
*H03K 9/00* (2006.01)
*H04B 1/28* (2006.01)
*H03D 7/18* (2006.01)

(52) U.S. Cl.
CPC .......... *H04B 1/28* (2013.01); *H03D 2200/0086* (2013.01); *H03D 7/18* (2013.01)
USPC ........... 375/316; 375/147; 375/280; 375/306; 375/327

(58) Field of Classification Search
CPC .... H03D 1/28; H03D 7/18; H03D 2200/0086
USPC ............ 375/316, 147, 280, 306, 327; 455/73, 455/260, 318, 323
See application file for complete search history.

(56) References Cited

U.S. PATENT DOCUMENTS

| 4,352,210 | A  |   | 9/1982  | Puckette |
|-----------|----|---|---------|----------|
| 5,977,896 | A  | * | 11/1999 | Kohdaka et al. ............... 341/143 |
| 6,404,263 | B1 |   | 6/2002  | Wang |
| 6,799,029 | B2 | * | 9/2004  | Wu ................................ 455/323 |
| 7,280,003 | B2 | * | 10/2007 | Belot et al. ..................... 332/144 |
| 7,280,163 | B2 | * | 10/2007 | Suzuki et al. .................. 348/731 |
| 2001/0018334 | A1 | * | 8/2001 | Ipek et al. ..................... 455/318 |
| 2003/0138062 | A1 | * | 7/2003 | Smith ............................ 375/329 |
| 2006/0115005 | A1 | * | 6/2006 | Hickling ....................... 375/247 |

FOREIGN PATENT DOCUMENTS

TW            I226750            1/2005

* cited by examiner

*Primary Examiner* — Dhaval Patel
(74) *Attorney, Agent, or Firm* — McClure, Qualey & Rodack, LLP (57) ABSTRACT

A mixer for the elimination of harmonic mixing in signal transmission is presented. The mixer incorporates a mixing unit and a modulation output unit. The mixing unit receives an input signal and a modulated signal, and outputs an output signal after signal mixing. The modulation output unit is for the generation of modulated signals, which are usually pulse-width modulated. The modulation output unit includes a delta sigma modulator and a digital domain code generator. The delta sigma modulator outputs the modulated signal responding to the received oscillation signal and digital domain code, the digital domain code generator generates the digital domain code in order to provide digital domain sine wave code for the use of the delta sigma modulator. The oscillation signal may be a signal of constant hi-frequency, or a signal that has a frequency larger or equal to that of the input signal by an integer factor.

17 Claims, 8 Drawing Sheets

HARMONIC ELIMINATION MIXER

BACKGROUND OF THE INVENTION

1. Field of the Invention

The present invention generally relates to a circuit utilized for signal transmission, and more particularly, to a signal mixing method and signal mixing circuit for eliminating harmonic mixing signals

2. Description of the Prior Art

Figure 1:
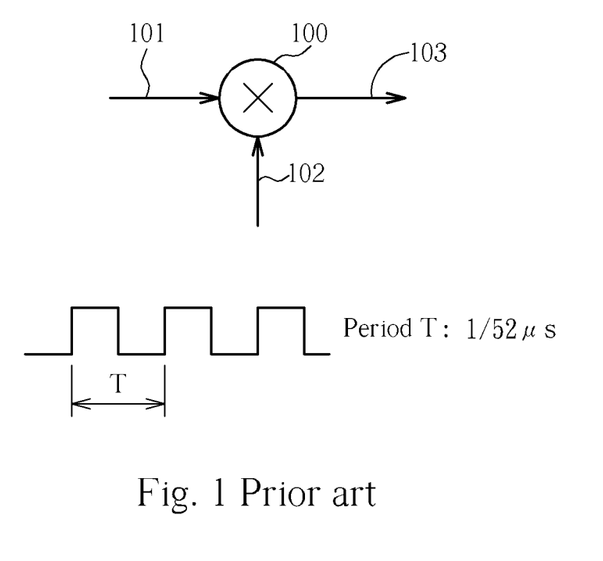
FIG. 1 is a diagram of a conventional mixer.
Figure 2:
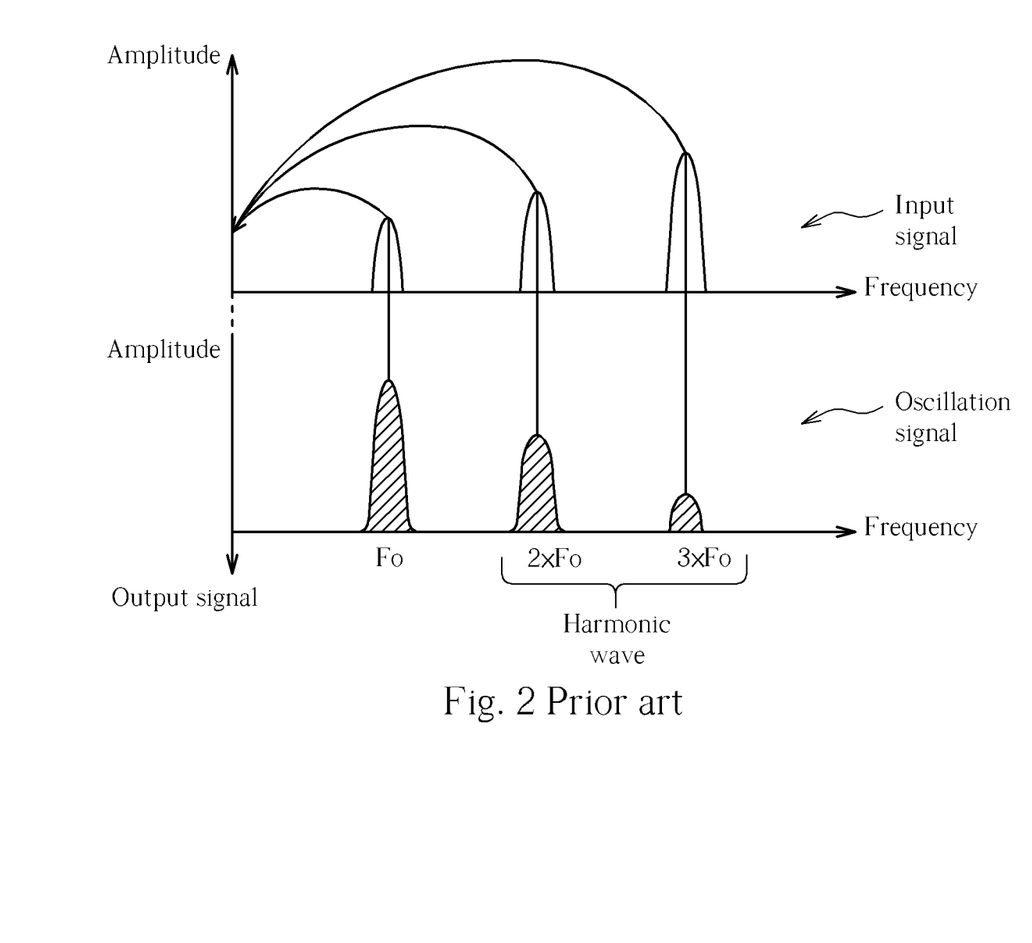
FIG. 2 is a diagram illustrating channel signals of a mixer according to the prior art.

The harmonic mixing problem is often seen in many wideband signal transmission applications. Please refer to FIG. 1 and FIG. 2. FIG. 1 is a diagram of a conventional mixer. As shown in FIG. 1, the mixing unit 100 of the mixer receives an input signal 101 and an oscillation signal 102, provided by the mixer, to generate a mixed output signal 103. Taking the digital TV for example, the entire frequency band is 48 MHz-860 MHz, where each channel bandwidth is 6 MHz, 7 MHz, or 8 MHz. If the signal carried in the first channel (~52 MHz) is fetched through the direct down conversion, not only the wanted signal having the frequency (~52 MHz) is obtained, but also signals having the harmonic frequencies 2Fo, 3Fo, ... , nFo. As shown in FIG. 2, this causes the output signal obtained to include not only the first channel signal as expected but also the harmonics of the first channel signal. This is due to the fact that the mixing unit 100 is usually not an ideal multiplier and harmonics are included in the oscillation signal provided. For example, in the case of an oscillation square wave signal, the Fourier series of the square wave can be represented as a plurality of sine waves with components having different frequencies. Therefore, in the frequency domain, unlimited harmonics can be observed, and when the harmonics fall within the frequency band of interest, the above-mentioned harmonic mixing problem occurs.

To solve the harmonic mixing problem, one conventional way is to apply an up conversion and then a down conversion. That is, the frequency Fo of the oscillation signal is set to be at a high frequency such that the harmonic frequencies 2Fo, 3Fo, ... , nFo do not fall within the frequency band of interest. However, this solution requires additional mixing units and generally utilizes an external surface acoustic wave (SAW) filter and therefore, and is not a cost effective solution.

SUMMARY OF THE INVENTION

It is therefore one of the primary objectives of the claimed invention to provide a solution for the above-mentioned problem.

According to an exemplary embodiment of the claimed invention, a mixer is disclosed. The mixer comprises: a mixing unit, for receiving an input signal and a modulated signal and mixing the input signal and the modulated signal to generate an output signal; and a modulation output unit, for generating the modulated signal; wherein the modulated signal is a pulse width modulation signal (PWM signal).

In addition, according to a preferred embodiment of the claimed invention, the modulation output unit comprises a delta sigma modulator and a digital domain code generator. The delta sigma modulator receives a digital domain code and an oscillation signal and outputs the modulated signal. The digital domain code generator is utilized to generate the digital domain code, which provides a digital domain sine wave code. The oscillation signal can be a fixed high frequency signal or a signal having a frequency that is n times that of the frequency of the input signal, where n is an integer.

According to another preferred embodiment of the claimed invention, the modulation output unit can comprise a memory for storing a needed digital domain code utilized for generating the modulated signal, and output the modulated signal through utilizing the method of referencing a look-up table.

According to another preferred embodiment of the claimed invention, if the pulse width modulation signal is processed through a low pass filter, then a corresponding sine wave signal can be generated.

These and other objectives of the present invention will no doubt become obvious to those of ordinary skill in the art after reading the following detailed description of the preferred embodiment that is illustrated in the various figures and drawings.

DETAILED DESCRIPTION

The embodiments of the present invention will be illustrated with figures. Please note, the range, and the spirit of the present invention are not limited to the embodiments presented here. Furthermore, the figures are not limited as to a specific size or scale. Moreover, the following structure and the material can be replaced properly.

Figure 3:
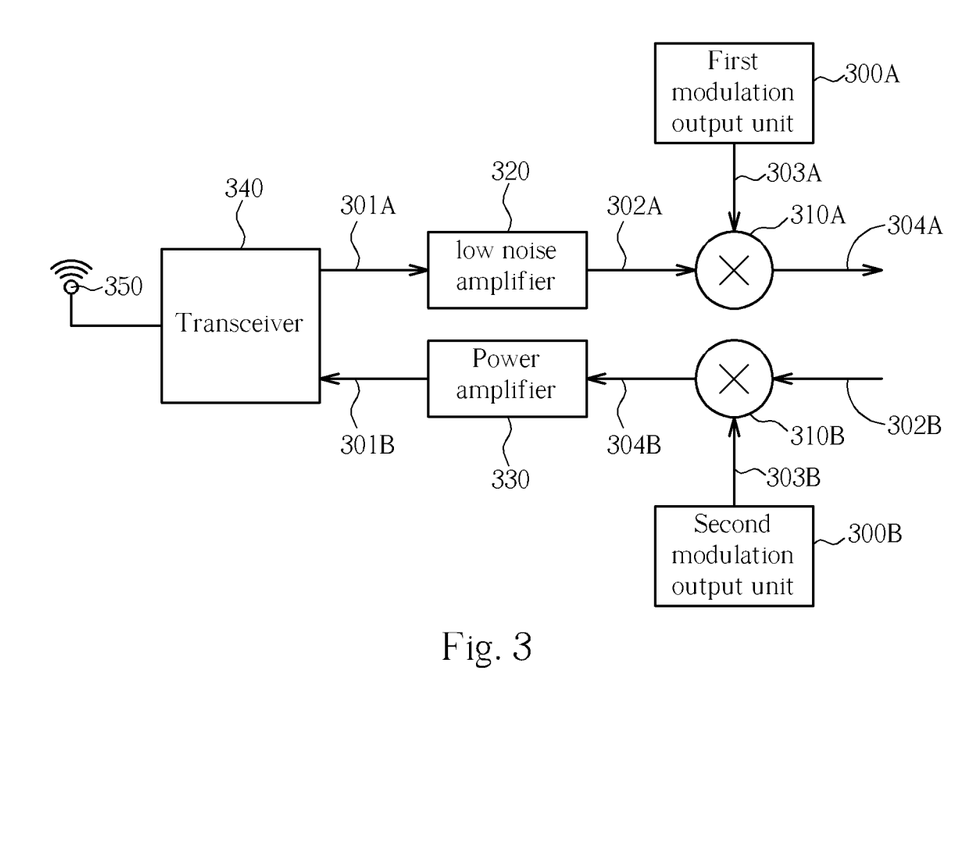
FIG. 3 is a diagram of a system of an embodiment according to the present invention.

Please refer to FIG. 3, which illustrates an embodiment of the present invention. As shown in FIG. 3, the system comprises a first modulation output unit 300A, a second modulation output unit 300B, a first mixing unit 310A, a second mixing unit 310B, a low noise amplifier 320, a power amplifier 330, a duplexer 340, and an antenna 350. The first modulation output unit 300A and the second modulation output unit 300B are utilized to generate a first pulse width modulation signal 303A and a second pulse width modulation signal 303B, respectively.

As shown in FIG. 3, an electro-magnetic wave is picked up by the antenna 350 and a receiving signal 301A is generated through the duplexer 340 according to the electro-magnetic wave. And then, the receiving signal 301A is input into the low noise amplifier 320, and amplified as a first input signal 302A by the low noise amplifier. The first pulse width modulation signal 303A and the first input signal 302A are received and mixed such that the first output signal 304A is generated accordingly. The first output signal is then processed by the receive side circuit (not shown). Similarly, the second input signal 302B provided by the transmit side circuit (not shown) and the second pulse width modulation signal 303B are mixed by the second mixing unit 310B to generate a second output signal 304B. The second output signal 304B is amplified by the power amplifier 330 to generate a transmitting signal 301B. And the transmitting signal is transmitted through the duplexer 340 to the antenna 350. At last, the antenna 350 sends out the transmitting signal.

Figure 4:
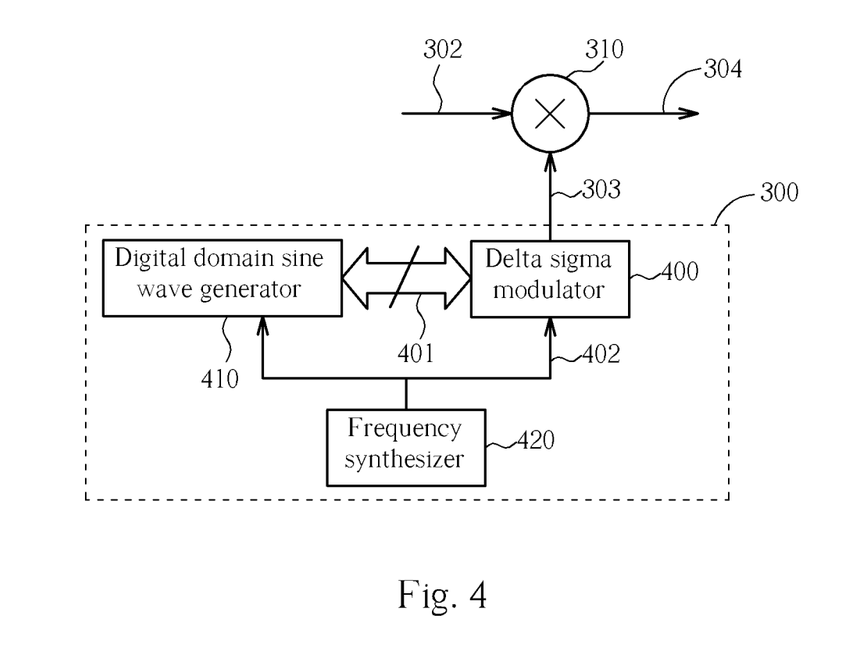
FIG. 4 is a diagram of a mixer of an embodiment according to the present invention.

Please refer to FIG. 4, which illustrates an embodiment of a mixer according to the present invention. In this embodiment, the mixer comprises a mixing unit 310, which is similar to the above-mentioned first mixing unit 310A and the second mixing unit 310B, and a modulation output unit 300, which is similar to the above-mentioned first modulation output unit 300A and the second modulation output unit 300B.

As shown in FIG. 4, the modulation output unit 300 comprises a delta sigma modulator 400, a digital domain sine wave generator 410, and a frequency synthesizer 420. The frequency synthesizer 420 provides an oscillation signal 402 to the delta sigma modulator 400 and the digital domain sine wave generator 410. The digital domain sine wave generator 410 outputs a digital domain sine wave code 401 to the delta sigma modulator 400. After receiving the digital domain sine wave code 401, the delta sigma modulator 400 outputs the pulse width modulation signal 303 according to the oscillation signal 402. The signal quality of the output signal 304 is determined after the pulse width modulation signal 303 and the input signal 302 are mixed. To obtain better resolution, the frequency of the oscillation signal 402 can be n times the core frequency of the frequency band of interest, where n is an integer. The frequency of the oscillation signal 402 could also be set at fixed high frequency (for example, 10 GHz), for the advantage of easier design, and the high frequency signal is utilized for oversampling such that a better resolution can be obtained.

To solve the harmonic mixing problem, the present invention utilizes sine waves having one frequency or multiple specific frequencies to replace the original oscillation signal (for example, a common-used square signal). Therefore, the harmonic mixing problem caused by the harmonic waves of the oscillation signal can be prevented.

Figure 5:
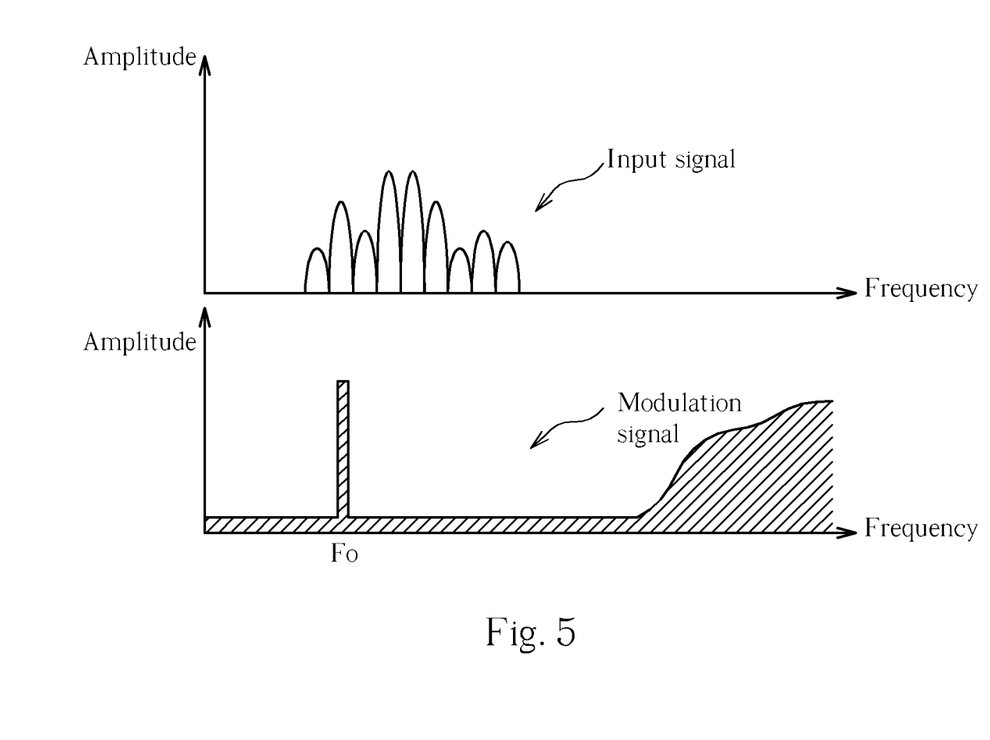
FIG. 5 is a diagram of an input signal and a modulation signal in a frequency domain according to the present invention.

As shown in FIG. 5, the harmonic signals and the noise do not influence the normal output signal because the delta sigma modulator 400 can retain the signal corresponding to the core frequency Fo in the frequency band of interest while other harmonic signals and noises are moved to the high frequency bands.

Figure 6:
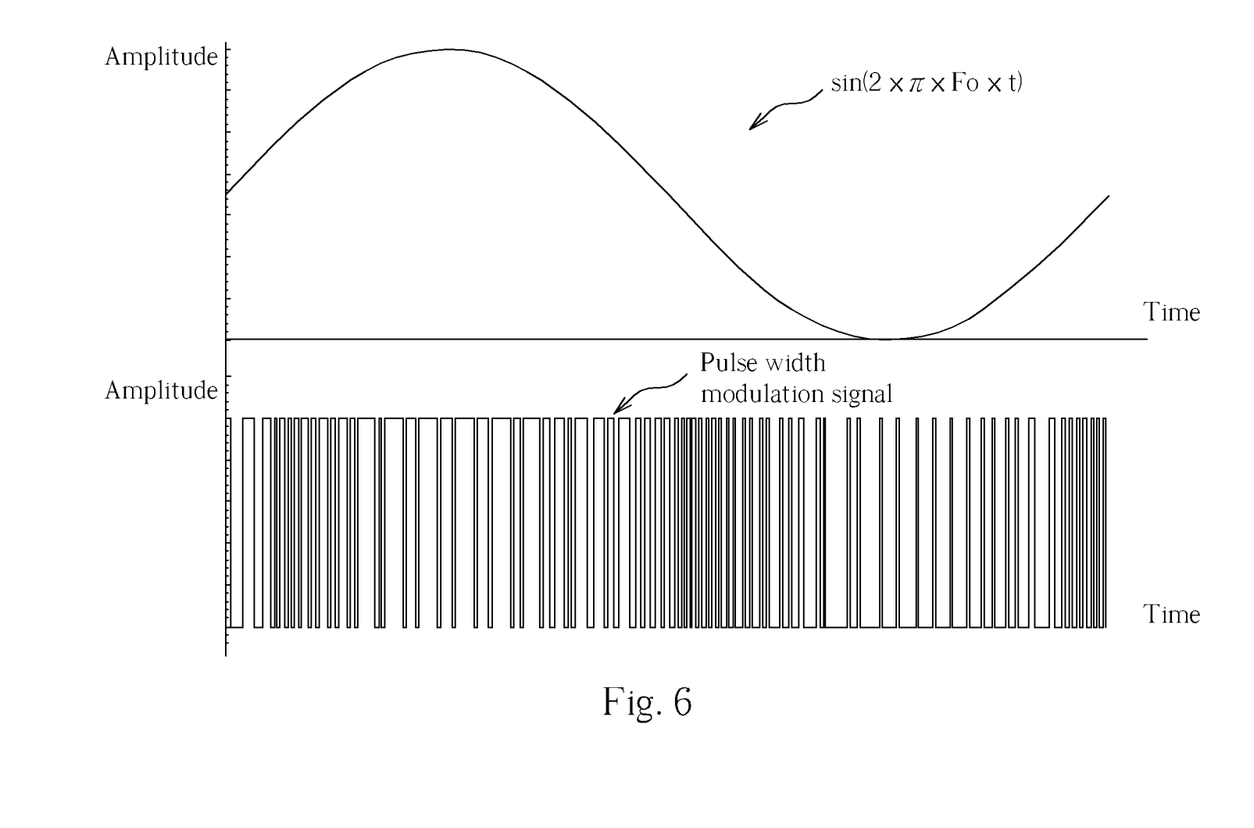
FIG. 6 is a diagram of a pulse width modulation signal and corresponding low frequency parts.

Please refer to FIG. 6. As shown in FIG. 6, the digital signal shown in the bottom is the pulse width modulation signal 303 generated by the delta sigma modulator 400, and the signal shown on top is an analog sine wave signal $\sin(2\pi \ast F_0 \ast t)$ corresponding to the low frequency parts of the pulse width modulation signal 303. Therefore, in the frequency domain, the modulated signal (i.e., the pulse width modulation signal 303) at the core frequency Fo is generated. Additionally, other harmonic waves and the noises are moved to the high frequency such that they do not influence the generated modulated signal.

Figure 7:
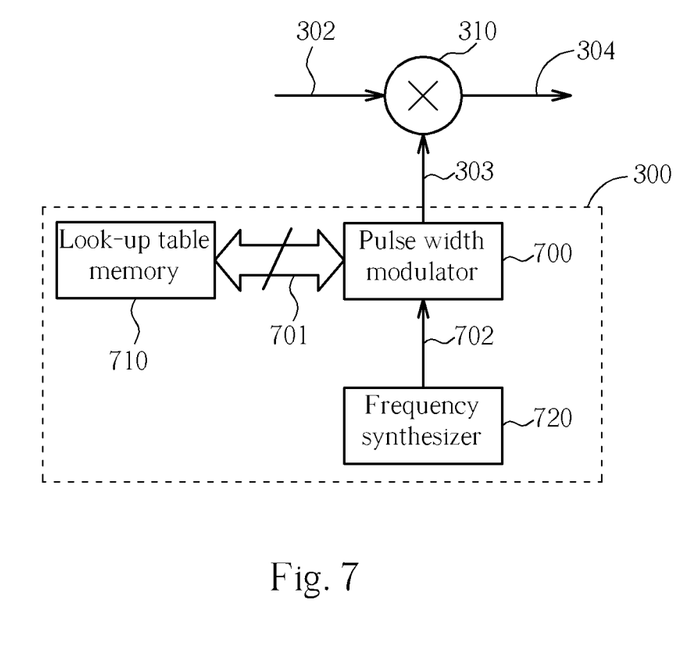
FIG. 7 is a diagram of a mixer of another embodiment according to the present invention.

Please refer to FIG. 7, which is a modulation output unit 300 of another embodiment according to the present invention. In this embodiment, the modulation output unit 300 comprises a pulse width modulator 700, a look-up table memory 710, and a frequency synthesizer 720. The frequency synthesizer 720 provides an oscillation signal 702 to the pulse width modulator 700. The pulse width modulator 700 extracts sine wave code 701 from the look-up table memory 710, and outputs the pulse width modulation signal 303 according to the oscillation signal 702 to the mixing unit 310. The mixing unit 310 receives the input signal 302 and the pulse width modulation signal 303 to generate the output signal 304 after mixing the input signal 302 and the pulse width modulation signal 303. As a result, noise and the harmonics will be removed in the output since the signal corresponding to the core frequency Fo is the only one remaining in the generated pulse width signal 303. Similar to the embodiment shown in FIG. 4, to obtain better resolution, the frequency of the oscillation signal 702 can be set at a frequency that is n times the core frequency of the frequency band of interest, or at a fixed high frequency (for example, 10 GHz), where n is an integer.

In the above-mentioned embodiments, if I channel and Q channel transmissions have to be achieved, the digital domain sine wave generator 410 is used for generating orthogonal sine code and cosine code, while the modulation output unit 300 can generate the I channel signal and Q channel signal. Similarly, the look-up table memory 710 could store the orthogonal sine code and cosine code, while the rest should work in the same manner.

Figure 8:
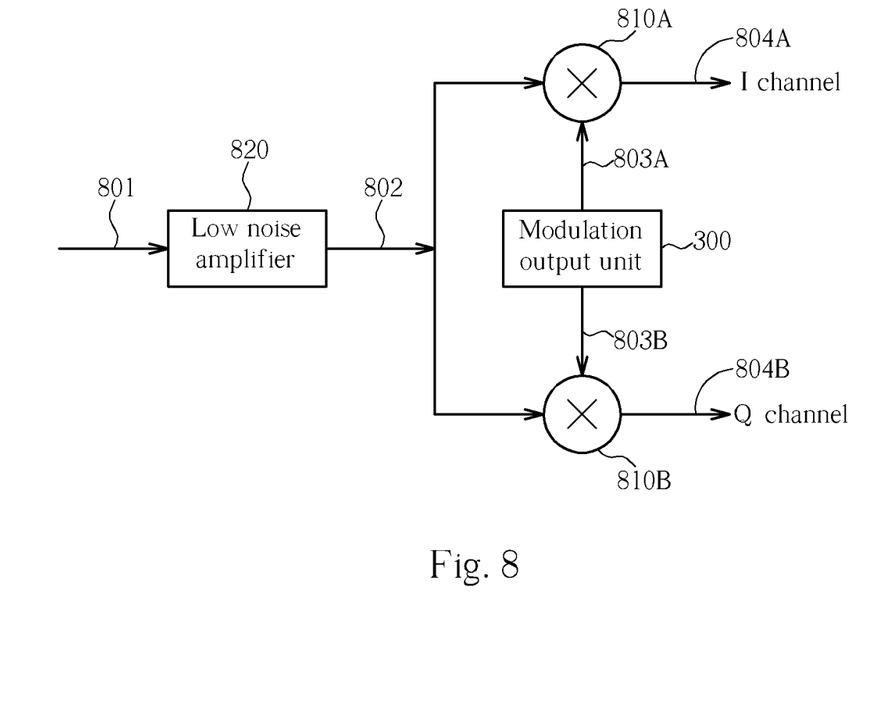
FIG. 8 is a diagram of a receiver of an embodiment according to the present invention.

Please refer to FIG. 8, which illustrates an embodiment of a receiver according to the present invention. The receiver comprises a modulation output unit 300, an I channel mixer 810A, a Q channel mixer 810B, and a low noise amplifier 820. The receiving signal 801 is amplified by the low noise amplifier 820 to generate an input signal 802. The input signal 802 is then inputted into the I channel mixer 810A and the Q channel mixer 810B. The modulation output unit 300 respectively outputs an I channel modulation signal 803A and a Q channel modulation signal 803B. Furthermore, the input signal 802 and the I channel modulation signal 803A are mixed by the I channel mixer 810A to generate an I channel output signal 804A. Similarly, the input signal 802 and the Q channel modulation signal 803B are mixed by the Q channel mixer 810B to generate a Q channel output signal 804B. In this embodiment, the input signal 802 can be an RF (radio frequency) signal, and the I channel output signal 804A and the Q channel 804B can be IF (intermediate frequency) signals, which includes low IF signals and zero IF signals.

In the above-mentioned embodiments, a singled out core frequency is provided, which then prevents harmonic mixing problems. Dedicated circuit structures could easily be designed by those skilled in the art according to the detailed description of this invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mixer comprising:
    a mixing unit, for receiving an input signal and a modulated signal and mixing the input signal and the modulated signal to generate an output signal; and
    a modulation output unit comprising:
    circuitry for generating the modulated signal;
    a digital domain code generator for generating a digital domain code comprising a digital domain sine wave code and a digital domain cosine wave code utilized for generating an in phase vector and a 90 degree phase shifted vector of the modulated signal, the circuitry arranged to receive the digital domain code and an oscillation signal,
    the modulation output unit having an output that is directly connected to an input of the mixing unit, wherein the modulated signal is communicated to the mixing unit via the output;
    wherein the modulated signal is a pulse width modulation signal.

2. The mixer of claim 1, wherein the input signal is either an RF signal or an IF signal.

3. The mixer of claim 1, wherein the output signal is either an RF signal or an IF signal.

4. The mixer of claim 1, wherein the modulation output unit comprises:
   the circuitry configured as a delta sigma modulator, for receiving the digital domain code and the oscillation signal and outputting the modulation signal.

5. The mixer of claim 4, wherein the oscillation signal is a fixed high frequency signal.

6. The mixer of claim 5, wherein frequency of the fixed high frequency signal is not smaller than 860 MHz.

7. The mixer of claim 4, wherein the oscillation signal frequency is N times the input signal frequency, wherein N is an integer.

8. The mixer of claim 4, wherein the oscillation signal is selected from the group consisting of a square wave signal, a triangle wave signal, a trapezoid wave signal, and a sine wave signal.

9. The mixer of claim 1, wherein the modulation output unit comprises:
   a memory, for storing the digital domain code needed for generating the modulated signal and generating the modulated signal through a method of referencing a look-up table.

10. The mixer of claim 9, wherein the modulated signal is generated according to an oscillation signal with a fixed high frequency.

11. The mixer of claim 10, wherein the fixed high frequency is not smaller than 860 MHz.

12. The mixer of claim 9, wherein the modulated signal is generated according to a frequency N times the input signal frequency.

13. A receiver utilized for signal transmission, the receiver comprising:
   a mixing unit, for receiving an input signal and a modulated signal and mixing the input signal and the modulated signal to generate an output signal;
   a modulation output unit, for receiving an oscillation signal for generating the modulated signal, the modulation output unit having an output that is directly connected to an input of the mixing unit, wherein the modulated signal is communicated directly to the mixing unit via the output;
   a digital domain code generator for generating a digital domain code comprising a digital domain sine wave code and a digital domain cosine wave code utilized for generating an in phase vector and a 90 degree phase shifted vector of the modulated signal,
   an amplifier, coupled to the mixing unit, for providing the input signal which has been amplified appropriately; and
   a frequency synthesizer, for providing the oscillation signal for the modulation output unit;
   wherein the modulated signal is a pulse width modulation signal.

14. The receiver of claim 13, wherein the modulation output unit comprises:
   a delta sigma modulator, for receiving a digital domain code and the oscillation signal and outputting the modulated signal; and
   a digital domain code generator, for generating the digital domain code.

15. The receiver of claim 14, wherein the digital domain code is a digital domain sine wave code.

16. The receiver of claim 13, wherein the modulation output unit comprises:
   a memory, for storing a digital domain code needed for generating the modulated signal and outputting the modulated signal through a method of referencing a look-up table.

17. The receiver of claim 13, wherein low frequency parts of the pulse width modulation signal correspond to a sine wave signal.

* * * * *